United States Patent
Spooner et al.

(10) Patent No.: US 9,887,160 B2
(45) Date of Patent: Feb. 6, 2018

(54) MULTIPLE PRE-CLEAN PROCESSES FOR INTERCONNECT FABRICATION

(71) Applicant: International Business Machines International, Armonk, NY (US)

(72) Inventors: Terry A. Spooner, Clifton, NY (US); Wei Wang, Yorktown Heights, NY (US); Chih-chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/864,058

(22) Filed: Sep. 24, 2015

(65) Prior Publication Data

US 2017/0092590 A1    Mar. 30, 2017

(51) Int. Cl.
*H01L 23/532* (2006.01)
*H01L 21/768* (2006.01)
*H01L 21/3213* (2006.01)

(52) U.S. Cl.
CPC .. *H01L 23/53238* (2013.01); *H01L 21/32136* (2013.01); *H01L 21/7684* (2013.01); *H01L 21/76805* (2013.01); *H01L 21/76814* (2013.01); *H01L 21/76826* (2013.01); *H01L 21/76877* (2013.01); *H01L 21/76883* (2013.01); *H01L 23/53295* (2013.01)

(58) Field of Classification Search
CPC ......... H01L 21/76822; H01L 21/76826; H01L 21/76838; H01L 21/76865; H01L 21/76883; H01L 23/53295; H01L 23/5226
See application file for complete search history.

(56) References Cited

U.S. PATENT DOCUMENTS

| | | | | |
|---|---|---|---|---|
| 6,028,015 A | * | 2/2000 | Wang | H01L 21/3105 257/607 |
| 6,143,377 A | * | 11/2000 | Miyamoto | H01L 21/28512 257/E21.162 |
| 6,204,192 B1 | * | 3/2001 | Zhao | H01L 21/02063 134/1.2 |

(Continued)

OTHER PUBLICATIONS

List of IBM Patents or Patent Applications Treated as Related; (Appendix P), Filed Jun. 8, 2017; 2 pages.

*Primary Examiner* — Michele Fan
(74) *Attorney, Agent, or Firm* — Cantor Colburn LLP; Vazken Alexanian

(57) ABSTRACT

A method of making an interconnect structure includes forming an opening within a dielectric material layer disposed on a substrate including a conductive material, the opening extending from a first surface to a second surface of the dielectric material layer and being in contact with a portion of the substrate; performing a plasma treatment process to chemically enrich exposed surfaces of the dielectric material that line the opening to form a chemically-enriched dielectric surface layer that included an element in a higher concentration than a remaining portion of the dielectric material layer; performing a chemical treatment process to remove a metal contact product from the portion of the substrate that is in contact with the opening; and disposing a conductive material in the opening to substantially fill the opening and form the interconnect structure.

3 Claims, 6 Drawing Sheets

(56) References Cited

U.S. PATENT DOCUMENTS

| | | | |
|---|---|---|---|
| 6,281,116 B1* | 8/2001 | Yanagida | H01L 21/76814 257/E21.577 |
| 6,284,644 B1* | 9/2001 | Aug | G01V 3/15 257/E21.576 |
| 6,352,938 B2* | 3/2002 | Chen | H01L 21/76814 134/1.1 |
| 6,534,397 B1* | 3/2003 | Okada | H01L 21/76826 257/E21.579 |
| 6,645,852 B1 | 11/2003 | Tagachi et al. | |
| 6,656,832 B1* | 12/2003 | Pan | H01L 21/31116 257/E21.252 |
| 6,667,231 B1* | 12/2003 | Wu | H01L 21/2855 257/E21.169 |
| 7,291,550 B2* | 11/2007 | Kim | H01L 21/02063 257/E21.226 |
| 7,547,669 B2 | 6/2009 | Lee | |
| 7,855,147 B1 | 12/2010 | Dulkin et al. | |
| 8,133,809 B2 | 3/2012 | Mao | |
| 8,236,681 B2 | 8/2012 | Nagano | |
| 8,420,531 B2 | 4/2013 | Yang et al. | |
| 2001/0030367 A1* | 10/2001 | Noguchi | H01L 21/02063 257/758 |
| 2002/0162736 A1* | 11/2002 | Ngo | H01L 21/02063 204/192.12 |
| 2002/0177303 A1 | 11/2002 | Jiang et al. | |
| 2003/0068895 A1* | 4/2003 | Kim | H01L 21/76814 438/700 |
| 2003/0181031 A1* | 9/2003 | Kojima | H01L 21/31116 438/627 |
| 2004/0229389 A1* | 11/2004 | Joei | H01L 21/76802 438/14 |
| 2005/0014375 A1* | 1/2005 | Kim | B08B 7/00 438/690 |
| 2005/0272247 A1* | 12/2005 | Ikeda | H01L 21/28556 438/618 |
| 2006/0009037 A1* | 1/2006 | Hong | H01L 21/7684 438/687 |
| 2006/0019485 A1* | 1/2006 | Komai | H01L 21/76811 438/627 |
| 2006/0214300 A1* | 9/2006 | Yamamoto | H01L 21/02063 257/758 |
| 2007/0082132 A1* | 4/2007 | Shinriki | C23C 16/0245 427/255.394 |
| 2007/0123043 A1* | 5/2007 | Streck | H01L 21/76802 438/687 |
| 2007/0145591 A1* | 6/2007 | Yano | H01L 21/76805 257/758 |
| 2008/0081464 A1* | 4/2008 | Matsuda | H01L 21/02063 438/660 |
| 2008/0311718 A1* | 12/2008 | Futase | C23C 16/0281 438/296 |
| 2010/0081595 A1 | 4/2010 | Sharma | |
| 2010/0099256 A1* | 4/2010 | Asako | H01L 21/3105 438/675 |
| 2010/0227470 A1* | 9/2010 | Nagano | H01L 21/02063 438/627 |
| 2010/0227472 A1* | 9/2010 | Futase | H01L 21/02063 438/653 |
| 2013/0330920 A1* | 12/2013 | Liu | H01L 21/02063 438/608 |
| 2017/0092538 A1 | 3/2017 | Spooner et al. | |

* cited by examiner

MULTIPLE PRE-CLEAN PROCESSES FOR INTERCONNECT FABRICATION

BACKGROUND

The present invention relates to semiconductor devices, and more specifically, to interconnect structures in semiconductor devices.

Generally, semiconductor devices include a plurality of circuits that form an integrated circuit (IC) fabricated on a semiconductor substrate. A complex network of signal paths is routed to connect the circuit elements distributed on the surface of the substrate. To efficiently route these signals across the device, multilevel or multilayered schemes are used, for example, single or dual damascene wiring structures. The wiring structure may include, for example, copper or a copper alloy. Copper-based interconnects may provide higher speed signal transmission between large numbers of transistors on a complex semiconductor chip than other types of interconnects, for example, aluminum-based interconnects.

Within an interconnect structure, metal vias run substantially normal to the semiconductor substrate. Metal lines run substantially parallel to the semiconductor substrate. The signal speed may be enhanced, and "crosstalk" between signals in adjacent lines may be reduced, by embedding the metal lines and metal vias (e.g., conductive features) within a low-k dielectric material.

SUMMARY

According to an embodiment, a method of making an interconnect structure includes forming an opening within a dielectric material layer disposed on a substrate including a conductive material, the opening extending from a first surface to a second surface of the dielectric material layer and being in contact with a portion of the substrate; performing a plasma treatment process to chemically enrich exposed surfaces of the dielectric material that line the opening to form a chemically-enriched dielectric surface layer that included an element in a higher concentration than a remaining portion of the dielectric material layer; performing a chemical treatment process to remove a metal contact product from the portion of the substrate that is in contact with the opening; and disposing a conductive material in the opening to substantially fill the opening and form the interconnect structure.

According to another embodiment, a method of making an interconnect structure included forming an opening within a dielectric material layer disposed on a substrate including a conductive material, the opening extending from a first surface to a second surface of the dielectric material layer and being in contact with a portion of the substrate; performing a first plasma treatment process to chemically enrich exposed surfaces of the dielectric material that line the opening to form a chemically-enriched dielectric surface layer that includes an element in a higher concentration than a remaining portion of the dielectric material layer; performing a second plasma treatment process to remove a metal contact product from the portion of the substrate that is in contact with the opening; disposing a conductive material in the opening; and performing a planarization process to form the interconnect structure.

Yet, according to another embodiment, an interconnect structure includes a substrate including a conductive material; a dielectric material layer disposed on the substrate and including an opening extending from a first surface to a second surface of the dielectric material layer that contacts a portion of the substrate, the portion of the substrate being substantially free of a metal contact product; a chemically-enriched dielectric surface layer formed on exposed surfaces lining the opening of the dielectric material layer, the chemically-enriched dielectric material layer including an element in a higher concentration than a remaining portion of the dielectric material layer; and a conductive material disposed in the opening.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-6 illustrate a process flow for making semiconductor devices according to various embodiments, in which:

FIG. 2 is a cross-sectional side view of an opening formed within a dielectric material over a conductive substrate;

FIG. 3 is a cross-sectional side view after chemically enriching the surface of the dielectric material lining the opening;

FIG. 4 is a cross-sectional side view after chemically treating the portion of the substrate in contact with the opening to remove metal compounds and contact products;

FIG. 5 is a cross-sectional side view after depositing a conductive material and performing a planarization process to form the interconnect structure; and FIG. 6 is a flow diagram for making an interconnect structure within a semiconductor device according to various embodiments.

DETAILED DESCRIPTION

During interconnect fabrication, a pre-clean process is used prior to metallization to remove metal compounds (e.g., copper oxide) and control the contact resistance. However, controlling the pre-clean process may be challenging. For example, the pre-clean process may damage the patterned dielectric around the interconnect structure, which may reduce device performance and reliability.

Figure 1:
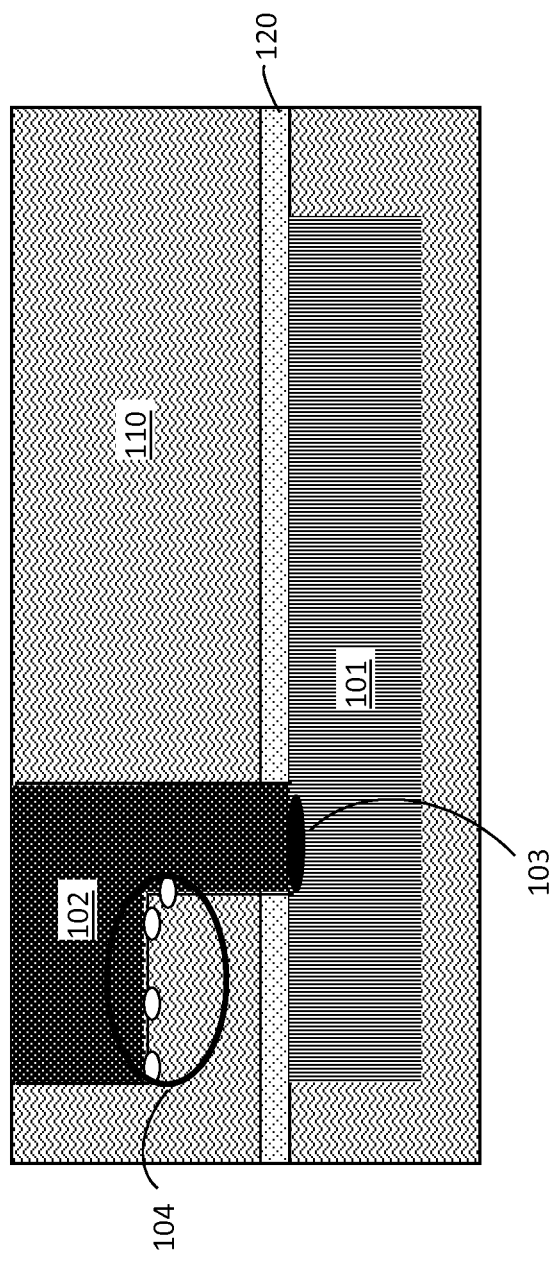
FIG. 1 is a cross-sectional side view of an interconnect structure formed from a chemical pre-clean process.

Referring to the Figures, FIG. 1 illustrates an interconnect structure 102 in a semiconductor device in which the dielectric layer 110 is damaged during pre-cleaning. The interconnect structure 102 contacts a conductive substrate 101 (metal layer). The interconnect structure 102 is patterned in the dielectric layer 110. A dielectric capping layer 120 may be disposed between the conductive substrate 101 and the dielectric layer 110. The portion 103 of the interconnect structure 102 that is in contact with the substrate 101 is pre-cleaned to remove copper compounds. Because physical pre-cleaning processes may result in damage, for example, shown in region 104, to the dielectric layer 110, a chemical type of pre-cleaning is a preferred process over the conventional physical sputtering for formation of the interconnects. It has also been noted that not only does the chemical type of pre-cleaning modify properties of the patterned dielectric surface, it reacts with exposed metal at bottom of the pattered feature (portion 103) and forms metal compounds. The metal compounds should be removed from portion 103 before continuing the metallization process.

Accordingly, various embodiments described herein provide methods of making interconnect structures for semiconductor devices that employ two surface modification (cleaning) processes. The dielectric surface is initially chemically-modified (e.g., by silylation, oxidation, nitridation, etc.) by a plasma treatment process. Then a second surface modification with reduced plasma ion density that removes metal contact products (e.g., copper compounds) from the portion 103 of the interconnect structure 102 is employed. The second process removes copper compounds that result from a metal reacting with, for example, silicon compounds, oxygen compounds, and nitrogen compounds. Employing the second process to remove copper compounds improves both device reliability and performance. The methods described herein do not damage the surrounding dielectric material and substantially remove metal compounds (e.g., copper compounds) from the via contact. Like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2:
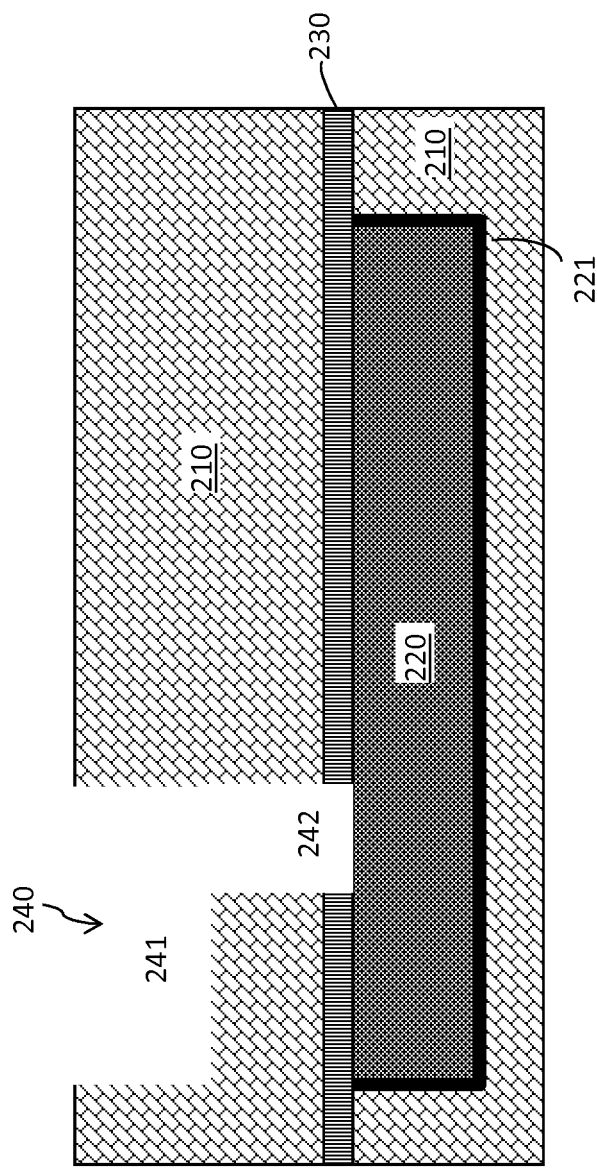

Turning again to the Figures, FIGS. 2-6 illustrate a process flow for making semiconductor device according to various embodiments. FIG. 2 is a cross-sectional side view of a patterned dielectric material 210 on a substrate 220. The substrate 220 may include a semiconducting material, a conducting material, an insulating material, or any combination thereof. When the substrate 220 includes a semiconducting material, any material having semiconductor properties such as, for example, Si, SiGe, SiGeC, SiC, Ge alloys, GaAs, InAs, InP and other III/V or II/VI compound semiconductors, may be used. The substrate 220 may be a layered semiconductor such as, for example, Si/SiGe, Si/SiC, silicon-on-insulators (SOIs) or silicon germanium-on-insulators (SGOIs).

When the substrate 220 is an insulating material, the insulating material may be an organic insulator, an inorganic insulator or a combination thereof, including multilayers. When the substrate 220 is a conducting material, the substrate 220 may include, for example, polysilicon, an elemental metal, alloys of elemental metals, a metal silicide, a metal nitride or any combination thereof, including multilayers. When the substrate 220 comprises a semiconducting material, one or more semiconductor devices such as, for example, complementary metal oxide semiconductor (CMOS) devices can be fabricated thereon. When the substrate 220 comprises a combination of an insulating material and a conductive material, the substrate 220 may represent an underlying interconnect level of a multilayered interconnect structure.

In some embodiments, as shown in FIG. 2, the substrate 220 may be formed by providing a layer of the dielectric material 210, etching a trench in a layer of dielectric material 210 and filling the trench with a conductive metal. The dielectric material 210 may include any interlevel or intralevel dielectric material, including inorganic dielectrics and/or organic dielectrics. The dielectric material 210 may be deposited by a deposition process, including, but not limited to CVD, PVD, plasma enhanced CVD, atomic layer deposition (ALD), evaporation, chemical solution deposition, or like processes.

In one embodiment, the dielectric material 210 may be non-porous. In another embodiment, the dielectric material 210 may be porous. Some examples of suitable dielectrics that can be used as the dielectric material 210 include, but are not limited to, $SiO_2$, silsesquioxanes, carbon-doped oxides (i.e., organosilicates) that include atoms of Si, C, O and H, thermosetting polyarylene ethers, or multilayers thereof.

The interconnect dielectric material 210 may have a dielectric constant that is about 4.0 or less, or a dielectric constant of about 2.8 or less. All dielectric constants mentioned herein are relative to a vacuum, unless otherwise noted. The thickness of the interconnect dielectric material 12 may vary depending upon the type of dielectric material used as well as the exact number of dielectrics layers within the dielectric material 210.

The conductive metal of the substrate 220 may be, for example, copper or aluminum. A liner 221 may be disposed within the trench before depositing the conductive metal. The liner 221 may be a metal diffusion barrier liner. Non-limiting examples of suitable materials for the liner 221 include tantalum (Ta), titanium (Ti), cobalt (Co), tungsten (Ru), ruthenium tantalum (RuTa), or any combination thereof. The liner 221 may be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

A dielectric capping layer 230 is disposed over the substrate 220 and dielectric material 210. The dielectric capping layer 230 may include, for example, a nitride (e.g., silicon nitride) or a carbide (e.g., silicon carbide).

Another layer of the dielectric material 210 is disposed on the dielectric capping layer 230. The dielectric material 210, and the dielectric capping 230 when present, is patterned. In some embodiments, a hard mask (not shown) is disposed on the dielectric material 210. The hard mask may include, for example, an oxide, a nitride, an oxynitride or any multilayered combination thereof. In one embodiment, the hard mask is an oxide, such as silicon dioxide. In another embodiment, the hard mask is a nitride, such as silicon nitride.

To pattern the dielectric material 210, at least one opening 240 is formed into the hard mask, if present, and into the dielectric material 210 utilizing lithography and etching. When a hard mask is not present, the opening 240 is formed only into the dielectric material 210. The lithographic process includes forming a photoresist (not shown) directly on the hard mask, if present, or directly on the dielectric material 210, if the hard mask is not present, exposing the photoresist to a desired pattern of radiation and developing the exposed photoresist utilizing a resist developer. The etching process includes a dry etching process (for example, reactive ion etching (RIE), ion beam etching, plasma etching or laser ablation), and/or a wet chemical etching process. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying dielectric material 210.

The depth of the opening 240 that is formed into the dielectric material 210 (measured from the exposed first surface of the dielectric material 210 to the substrate 220 surface or the second surface of the dielectric material 210) may vary. In some embodiments, a portion of the opening 240 may extend entirely through the dielectric material 210, as shown for portion 242, which forms the via contact (the opening extends from the first surface of the dielectric material 210 to the second surface). In yet other embodiments, the opening 240 stops within the dielectric material 210 itself, as shown for portion 241. In yet further embodiments, different depth openings can be formed into the dielectric material 210 (portions 241 and 242).

The opening 240 may form a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first, and then a via opening is formed atop and in communication with the line opening.

A single opening or a plurality of openings 240 may be formed. When a plurality of openings 240 is formed, each opening 240 can be a line opening, a via opening, a combined via/line opening, or any combination thereof.

When a via or line is formed, a single damascene process may be employed. When a combined via/line is formed, a dual damascene process (including at least one iteration of the above mentioned lithography and etching steps) can be employed.

In some embodiments, the hard mask that is formed on the dielectric material 210 may be removed from the structure after the dielectric material 210 has been patterned to include the opening 240. The hard mask may be removed utilizing a planarization process such as, for example, chemical mechanical planarization (CMP). In some other embodiments, the patterned hard mask can remain on the upper horizontal surface of the dielectric material 210, and the patterned hard mask is then removed during a subsequent planarization step.

Figure 3:
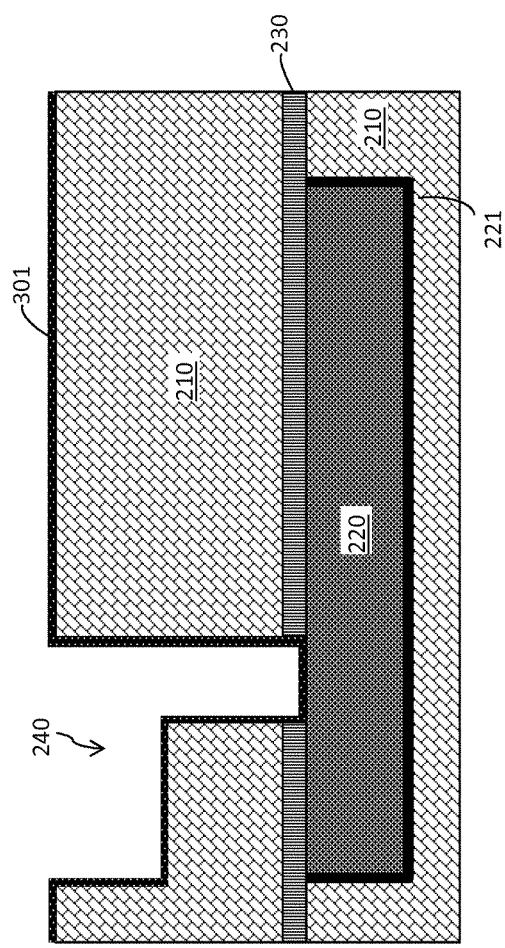

FIG. 3 is a cross-sectional side view after chemically modifying the surface of the dielectric material 210 to form an enriched surface layer 301. The enriched surface layer 301 is chemically enriched. The enriched surface layer 301 includes a higher concentration of an element than remaining portions of the dielectric material 210. In some embodiments, the enriched surface layer 301 includes a higher concentration (density) of silicon, nitrogen, phosphorus, boron, oxygen, or any combination thereof. In other embodiments, the enriched surface layer 301 includes a higher concentration of silicon compounds, nitrogen compounds, phosphorus compounds, boron compounds, or any combination thereof, than remaining portions of the dielectric material 210. The exposed surfaces of the dielectric material 210 along the opening 240 sidewalls are enriched. The exposed surface of the substrate 220 and the exposed surfaces of the dielectric capping layer 203 are also enriched (chemically modified).

The exposed surfaces of the dielectric material 210, substrate 220, and dielectric capping layer 230 are treated to provide a denser surface that is enriched with one or more types of atoms, elements, and/or compounds. The enriched surface layer 301 has a higher content of various atoms/elements after being physically modified as described below compared to the original dielectric material 210.

The chemical modification includes employing a plasma process (first plasma process). Although the plasma process includes an electrical bias of at least 100 Watts (W), it does not damage the dielectric material 210 or the opening 240. In some embodiments, the electrical bias is in a range from about 100 to about 600 W.

The surface modification process employed is performed in a plasma-containing environment. The surface modification process is performed, for example, using plasma that includes silicon (silicon plasma), nitrogen (nitrogen plasma), phosphorus (phosphorus plasma), boron (boron plasma), oxygen (oxygen plasma), or any combination thereof. In some embodiments, the plasma includes silicon compounds (e.g., $SiH_4$), nitrogen compounds (e.g., $N_2$, $NH_3$), phosphorus compounds (e.g., $P_4S_3$, $P_2O_5$), boron compounds, oxygen compounds (e.g., $BF_3$), or any combination thereof.

In one embodiment, the first surface modification process employed is performed at a temperature in a range from about 20 to about 600° C. In another embodiment, the first thermal process employed is performed at a temperature in a range from about 100 to about 300° C.

In some embodiments, the ion current density used during the first plasma treatment process is in a range from about 100 to about 5,000 $\mu A/cm^2$. In other embodiments, the ion current density used during the first plasma treatment process is in a range from about 500 to about 2,000 $\mu A/cm^2$.

The depth (thickness) of the enriched surface layer 301 may vary depending on the type of plasma employed, among other treatment conditions. In some embodiments, the depth of the enriched surface layer 301, as measured from the outer most exposed surface of the dielectric material 210 inward, is in a range from about 0.5 nm to about 20 nm. In other embodiments, the depth of the enriched surface layer 301 is in a range from about 1 nm to about 10 nm.

The chemical surface treatment may be employed one time. Or the chemical surface treatment may be employed multiple times.

Figure 4:
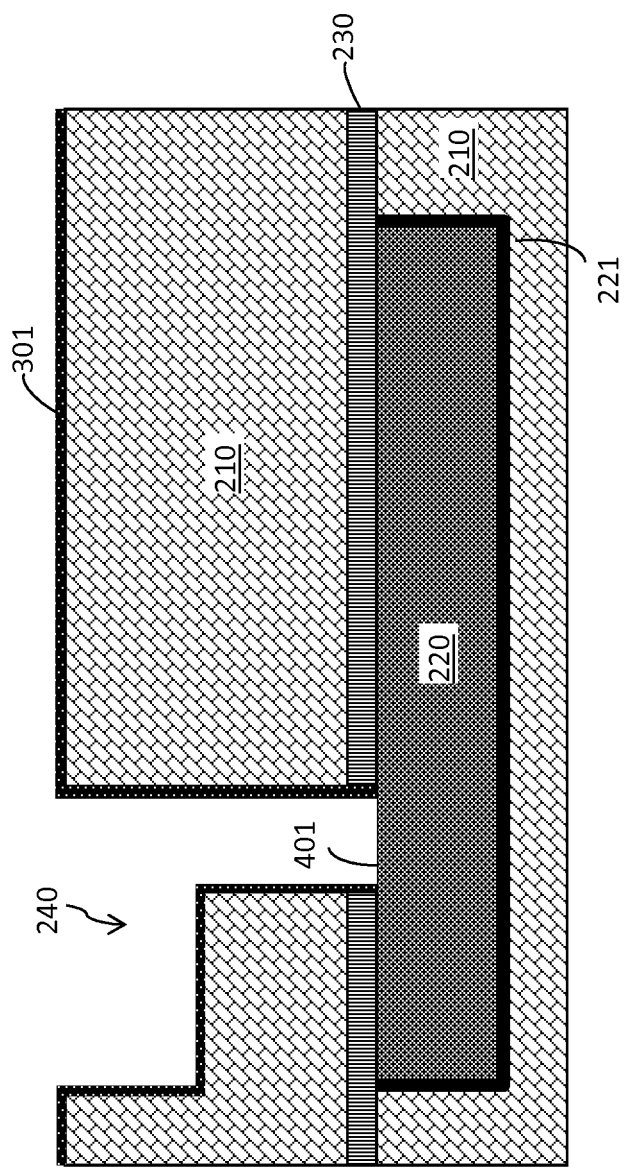

FIG. 4 is a cross-sectional side view after another chemically treating the portion 401 of the opening 240 (via) contacting the substrate 220. The chemical treatment is a second surface modification (second plasma treatment process) confined to the portion 401 of the opening that will directly contact the substrate 220. A portion of the substrate 220 is thus modified. In some embodiments, the substrate 220 is a conductive metal layer, and the portion of the opening 240 that will directly contact the conductive metal layer is chemically treated. The chemical treatment process employed removes metal compounds that may form from reaction of the substrate 220 material and the plasma compounds employed in the first thermal surface treatment process described in FIG. 3 (metal contact products).

In some embodiments, the substrate 220 includes copper, and copper compounds form on the substrate 220 at the portion 401 of the opening 240 contacting the substrate 220. The copper compounds may include compounds including copper and, for example, silicon, oxygen, nitrogen, boron, phosphorus, or any combination thereof.

The chemical surface treatment used to remove the metal compounds (metal contact products) from the via contact includes a plasma that may include, for example, hydrogen gas ($H_2$), helium gas (He), or a combination thereof.

The chemical surface treatment employed is performed using a lower plasma density than the physical surface treatment. The portion 401 of the opening 240 contacting the substrate 220 is reacted with the plasma.

In some embodiments, the ion current density used during the second plasma treatment process is less than 50 $\mu A/cm^2$. In other embodiments, the ion current density used during the second plasma treatment process is in a range from about 5 to about 20 $\mu A/cm^2$.

The second plasma surface treatment may be employed one time. Or the second plasma surface treatment may be employed multiple times.

Figure 5:
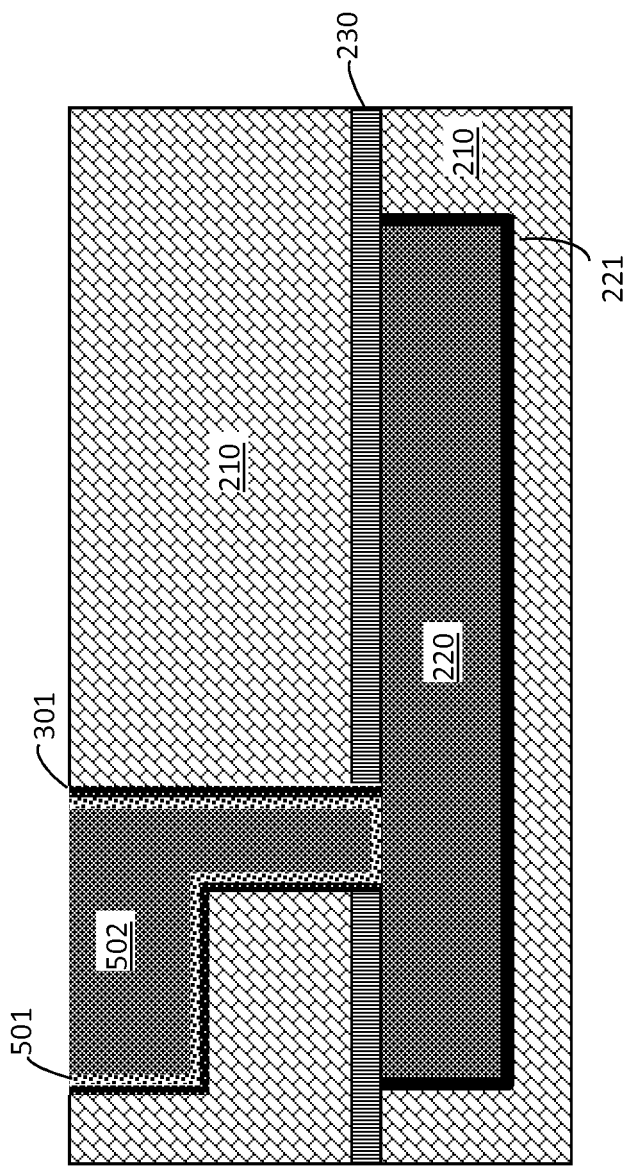

FIG. 5 is a cross-sectional side view after depositing a metal diffusion barrier liner 501 and a conductive material 502 in the opening 240 and performing a planarization process. The metal diffusion barrier liner 501 is disposed on the enriched surface layer 301. The metal diffusion barrier liner 501 directly contacts the substrate 220.

Non-limiting examples of suitable materials for the metal diffusion barrier liner 501 include tantalum (Ta), titanium (Ti), cobalt (Co), tungsten, ruthenium (Ru), ruthenium tantalum (RuTa), or any combination thereof. The metal diffusion barrier liner 501 may be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

The thickness of the metal diffusion barrier liner 501 may vary depending on the deposition process used as well as the material employed. In some embodiments, the metal diffusion barrier liner 501 has a thickness in a range from about 1 nm to about 50 nm. In other embodiments, the metal diffusion barrier liner 501 has a thickness in a range from about 2 nm to about 20 nm.

In some embodiments, an optional plating seed layer (not shown) may be formed on the surface of the metal diffusion barrier liner 501. The optional plating seed layer may be employed to selectively promote subsequent electroplating of a pre-selected conductive metal or metal alloy. The optional plating seed layer may include, for example, Cu, a Cu alloy, Ir, an Ir alloy, Ru, a Ru alloy (e.g., TaRu alloy) or other noble metal or noble metal alloy having a low metal-plating overpotential.

The thickness of the optional seed layer may vary depending on the material of the optional plating seed layer as well as the technique used in forming the same. In some embodiments, the optional plating seed layer has a thickness in a range from about 1 nm to about 80 nm. The optional plating seed layer may be formed by a deposition process including, for example, CVD, PECVD, ALD, and PVD.

The conductive material 502 is deposited on the metal diffusion barrier liner 501. The conductive material 502 fills the remaining portions of the interconnect opening. The conductive material 502 may include, for example, polySi, SiGe, a conductive metal, an alloy comprising at least one conductive metal, a conductive metal silicide or combinations thereof. In one embodiment, the conductive material 502 is a conductive metal such as copper (Cu), tungsten (W), aluminum (Al), cobalt (Co), ruthenium (Ru), or any combination thereof. In another embodiment, the conductive material 502 includes Cu or a Cu alloy, for example, AlCu.

The conductive material 502 may be formed by a deposition process, including, by not limited to, chemical vapor deposition (CVD), plasma enhanced chemical vapor deposition (PECVD), sputtering, chemical solution deposition or plating that fills from the bottom upwards (e.g., a bottom-up plating process).

After depositing the conductive material 502, a planarization process such as, for example, chemical mechanical polishing (CMP) and/or grinding, is employed to remove portions of the conductive material 502, the metal diffusion barrier liner 501 and the enriched surface layer 301 that extend above the mouth of the opening 240.

Figure 6:
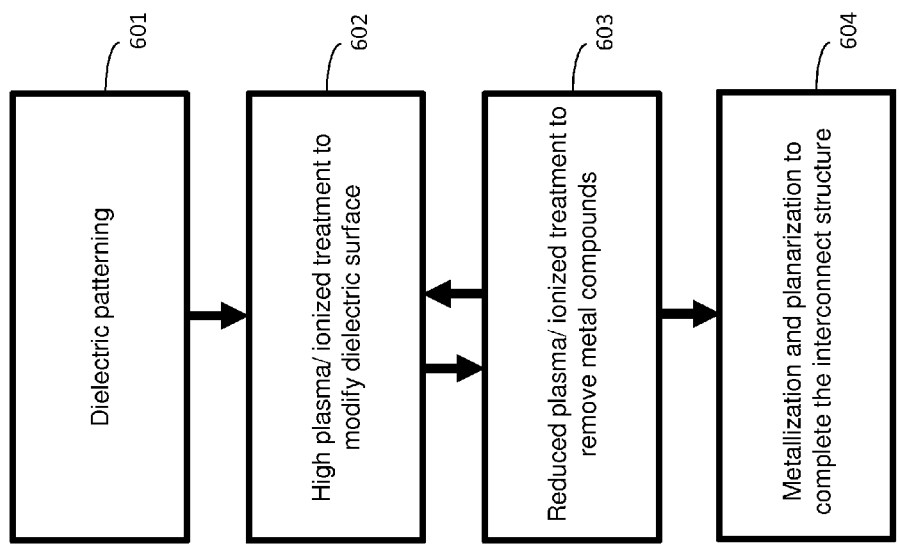

FIG. 6 is a flow diagram for making interconnect structures semiconductor devices according to various embodiments. In box 601, a dielectric material is patterned (see also, FIG. 2). In box 602, a high plasma/ionized treatment is performed to chemically modify the surface of the dielectric material (see also, FIG. 3). In box 603, a reduced plasma/ionized treatment is performed to remove metal compounds (see also, FIG. 4). In box 604, metallization and planarization are performed to complete the interconnect structure (see also, FIG. 5).

As described above, various embodiments described herein provide methods of making interconnect structures for semiconductor devices that employ two surface modification processes. The dielectric surface is initially chemically modified (e.g., by silylation, oxidation, nitridation, etc.). Then a second surface modification that removes copper compounds from the interconnect via contact region is employed. The second process removes metal (e.g., copper) compounds (or contact products) that result from reaction with, for example, silicon compounds, oxygen compounds, and nitrogen compounds. Employing the second process to remove metal compounds improves device reliability and performance. The methods described herein do not damage the surrounding dielectric material and substantially remove metal compounds (e.g., copper compounds) from the via contact.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interconnect structure, comprising:
    a substrate comprising a conductive material;
    a dielectric material layer disposed on the substrate and comprising an opening extending from a first surface to a second surface of the dielectric material layer that contacts a portion of the substrate;
    a chemically-modified dielectric surface layer formed on exposed surfaces lining sidewalls of the opening within the dielectric material layer, the chemically-modified dielectric surface layer being more dense than the dielectric material layer and comprising a plasma contact product, the plasma contact product being a first reaction product of the dielectric material layer and plasma, the plasma being a silicon-containing plasma, a nitrogen-containing plasma, a phosphorus-containing plasma, a boron-containing plasma, or an oxygen-containing plasma, and the chemically-modified dielectric material layer comprising a higher concentration of silicon, nitrogen, phosphorus, boron, or oxygen than the dielectric material layer; and
    a layer of plasma metal contact product arranged on the conductive material of the substrate at an end of the opening within the dielectric material layer, the layer of plasma metal contact product being a second reaction product of the conductive material and the silicon-containing plasma, the nitrogen-containing plasma, the phosphorus-containing plasma, the boron-containing plasma, or the oxygen-containing plasma.

2. The interconnect structure of claim 1, wherein the dielectric material layer is silicon dioxide, a silsesquioxane, a carbon-doped oxide, a thermosetting polyarylene ether, or any combination thereof.

3. The interconnect structure of claim 1, wherein the dielectric material layer further comprises another opening extending from the first surface into the dielectric material layer.

* * * * *